(12) United States Patent
Werber et al.

(10) Patent No.: US 9,240,450 B2
(45) Date of Patent: Jan. 19, 2016

(54) IGBT WITH EMITTER ELECTRODE ELECTRICALLY CONNECTED WITH IMPURITY ZONE

(71) Applicant: Infineon Technologies AG, Neubiberg (DE)

(72) Inventors: Dorothea Werber, Munich (DE); Volodymyr Komarnitskyy, Villach (AT); Thomas Gutt, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 14/178,419

(22) Filed: Feb. 12, 2014

(65) Prior Publication Data

US 2015/0228723 A1    Aug. 13, 2015

(51) Int. Cl.
| | | |
|---|---|---|
| H01L 29/74 | (2006.01) | |
| H01L 23/62 | (2006.01) | |
| H01L 29/08 | (2006.01) | |
| H01L 29/06 | (2006.01) | |
| H01L 29/10 | (2006.01) | |
| H01L 29/40 | (2006.01) | |
| H01L 29/47 | (2006.01) | |
| H01L 29/739 | (2006.01) | |

(52) U.S. Cl.
CPC ........ *H01L 29/0804* (2013.01); *H01L 29/0619* (2013.01); *H01L 29/1095* (2013.01); *H01L 29/401* (2013.01); *H01L 29/47* (2013.01); *H01L 29/7397* (2013.01)

(58) Field of Classification Search
CPC .................... H01L 29/1095; H01L 29/66325; H01L 29/7302; H01L 29/7393; H01L 29/7395; H01L 29/7397; H01L 2924/13055; H01L 25/00; H01L 27/00
USPC .................................................. 257/125, 355
See application file for complete search history.

(56) References Cited

U.S. PATENT DOCUMENTS

| | | |
|---|---|---|
| 5,416,359 A | 5/1995 | Oda |
| 6,211,568 B1 | 4/2001 | Hong |
| 6,855,999 B2 | 2/2005 | Hwang et al. |
| 2010/0327313 A1* | 12/2010 | Nakamura .......... H01L 29/0834 257/133 |
| 2015/0155279 A1* | 6/2015 | Konrath .............. H01L 27/0823 257/77 |
| 2015/0162407 A1* | 6/2015 | Laven ................. H01L 29/0696 257/139 |

\* cited by examiner

*Primary Examiner* — Hoai V Pham
(74) *Attorney, Agent, or Firm* — Murphy, Bilak & Homiller, PLLC

(57) ABSTRACT

A semiconductor device includes a semiconductor body including a drift zone of a first conductivity type, an emitter region of a second, complementary conductivity type configured to inject charge carriers into the drift zone, and an emitter electrode. The emitter electrode includes a metal silicide layer in direct ohmic contact with the emitter region. A net impurity concentration in a portion of the emitter region directly adjoining the metal silicide layer is at most $1 \times 10^{17}$ cm$^{-3}$.

13 Claims, 12 Drawing Sheets

IGBT WITH EMITTER ELECTRODE ELECTRICALLY CONNECTED WITH IMPURITY ZONE

BACKGROUND

The application relates to an electrical contact to semiconductor areas. For many known contact and barrier materials no or no ideal ohmic contact is feasible, if the contacted semiconductor material is lowly, e.g. lowly p-doped. In this case the persued ohmic contact reveals to be more like a Schottky contact including all its unfavorable characteristics, like an increased contact resistance, temperature dependent Schottky barrier and an accumulation of charge carriers of the other species.

In the field of semiconductor power devices like IGBTs (insulated gate bipolar transistors), RC-IGBTs (reverse conducting insulated gate bipolar transistors), diodes, lowly doped Silicon emitter areas are beneficial for enabling an adequate device performance with respect to low switching losses.

It is desirable to provide an improved electrical contact to an emitter region and to provide a manufacturing method thereof.

SUMMARY

According to an embodiment, a semiconductor device comprises a semiconductor body including a drift zone of a first conductivity type, an emitter region of a second, complementary conductivity type configured to inject charge carriers into the drift zone, and an emitter electrode. The emitter electrode comprises a metal silicide layer in direct ohmic contact with the emitter region. A net impurity concentration in a portion of the emitter region directly adjoining the metal silicide layer is at most $1 \times 10^{17}$ cm$^{-3}$.

According to an embodiment, in a method for manufacturing a semiconductor device, in a semiconductor body having a first surface and a second surface opposite to the first surface, a drift zone of a first conductivity type and an emitter region of a second, complementary conductivity type adjoining the first surface is formed. The emitter region is configured to inject charge carriers into the drift zone. A net impurity concentration in a portion of the emitter region directly adjoining the first surface is at most $1 \times 10^{17}$ cm$^{-3}$. Then, a metal layer is deposited on the first surface of the semiconductor body. After performing a silicidation step of the metal layer in contact with the portion of the emitter region directly adjoining the first surface, to form a metal silicide layer in direct ohmic contact with the emitter region, non-reacted metal of the metal layer is removed.

According to an embodiment, an IGBT includes a semiconductor body comprising IGBT cells. At least one of the IGBT cells comprises a source zone of a first conductivity type, a body zone of a second, complementary conductivity type, a drift zone of the first conductivity type separated from the source zone by the body zone, and an emitter electrode comprising a metal silicide layer that directly adjoins at least one of the body zone and a supplementary zone of the second conductivity type. A net impurity concentration in a portion of at least one of the body zone and the supplementary zone directly adjoining the metal silicide layer is at most $1 \times 10^{17}$ cm$^{-3}$.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
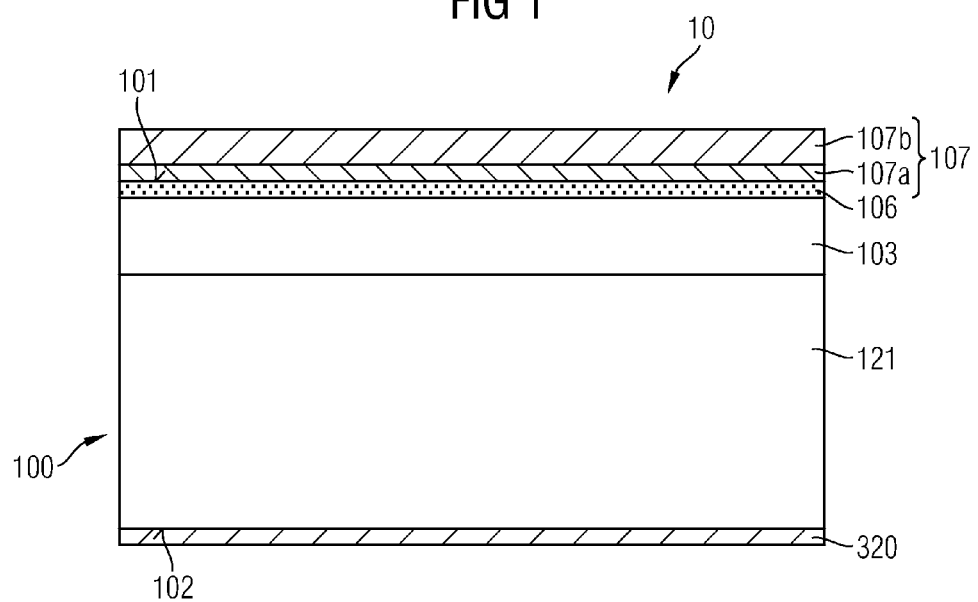
FIG. 1 is a schematic cross-sectional view of a portion of a semiconductor device in accordance with an embodiment.

FIG. 1 is a schematic cross-sectional view of a portion of a semiconductor device 10 in accordance with an embodiment. The semiconductor device 10 comprises a semiconductor body 100 having a first surface 101 and a second surface 102 opposite to the first surface 101. The semiconductor body 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 50 μm, for example at least 175 μm. Other embodiments may provide semiconductor bodies 100 with a thickness of several 100 μm. The semiconductor body 100 may have a rectangular shape with an edge length in the range of several millimeters. The normal to the first and second surfaces 101, 102 defines a vertical direction and directions orthogonal to the normal direction are lateral directions.

The semiconductor body 100 includes a drift zone 121, which directly adjoins the second surface 102, and an emitter region 103, which directly adjoins the first surface 101 of the semiconductor body 100. Although the drift zone 121 and the emitter region 103 are shown in FIG. 1 as directly adjoining regions, further functional layers between the drift zone 121 and the emitter region 103 as well as between the drift zone 121 and the second surface 102 can be provided. The drift zone 121 is of a first conductivity type and the emitter zone 103 is of a second, complementary conductivity type. The mean net impurity concentration in the drift zone 121 may be between $5 \times 10^{12}$ cm$^{-3}$ and $5 \times 10^{14}$ cm$^{-3}$, by a way of example. A collector electrode 320 directly adjoins the second surface 102 and is electrically connected to the drift zone 121 of the semiconductor body 100.

The emitter region 103 is configured to inject charge carriers into the drift zone 121. An emitter electrode 107 directly adjoins the first surface 101 and comprises a first metal layer 107a directly adjoining the first surface 101 of the semiconductor body 100 and a second metal layer 107b deposited on the first metal layer 107a.

The first metal layer 107a may contain titanium Ti and/or tantalum Ta as the only main constituent or as one of at least two main constituents. According to an embodiment, the first metal layer 107a contains titanium nitride TiN, tantalum nitride TaN, titanium Ti, and/or tantalum Ta. According to an embodiment, the first metal layer 107a is provided from a material having a higher contact resistance to a low-doped semiconductor material, e.g. low doped single-crystalline silicon, than to a heavily doped semiconductor material, e.g. heavily doped single-crystalline silicon. For example, the first metal layer 107a includes titanium tungstenide TiW. According to an embodiment the first metal layer 107a contains more tungsten than titanium. The first metal layer 107a may contain 5 to 40 atomic percent titanium and 60 to 95 atomic percent tungsten, for example 17% Ti and 83% tungsten.

The second metal layer 107b may include aluminum Al and/or copper Cu as the only main constituent or as one of at least two main constituents. The second metal layer 107b may include silicon Si as additional main constituent. The first metal layer 107a may be provided from a layer having at least one of titanium Ti and tantalum Ta as main constituent, for example TiN, TaN, Ta, or TiW or a combination thereof. The second metal layer 107b may be provided from Al with a copper content of approximately 0.5%. According to other embodiments, the second metal layer 107b may be a copper layer, an AlCu layer with additives like Si or an AlCu alloy. The first metal layer 107a is effective as a reliable diffusion barrier, for example against sodium Na. The second metal layer 107b may be provided without silicon as main constituent, resulting in improved deposition rates and layer conformity and in more reliable bond wire connections. A thin first metal layer 107a suffices to compensate leakage issues in the second metal layer 107b.

The net impurity concentration of the emitter region 103 or at least the net impurity concentration in the portion of the emitter region 103 directly adjoining the first surface 101 is at most $1 \times 10^{17}$ cm$^{-3}$. In another embodiment, the net impurity concentration of the emitter region 103 or at least the net impurity concentration in a portion of the emitter region 103 directly adjoining the first surface 101 is at most $5 \times 10^{16}$ cm$^3$. In still another embodiment, the net impurity concentration of the emitter region 103 or at least the net impurity concentration in a portion of the emitter region 103 directly adjoining the first surface 101 is at most $1 \times 10^{16}$ cm$^3$. A direct contact of the first metal layer 107a and the emitter region 103 at the first surface 101 may lead to a high contact resistance caused by a Schottky barrier between the first metal layer 107a and the emitter region 103.

The provision of a metal silicide layer 106 sandwiched between the emitter region 103 and the first metal layer 107a reduces the contact resistance between the first metal layer 107a and the emitter region 103. The metal silicide layer 106 may be a continuous layer or a liner layer covering the first surface 101. The metal silicide layer 106 is of continuous material and has a thickness in the range of 0.5 nm up to 300 nm. Since the liner-material of the metal silicide layer 106 is continuous and lacking a structure of a multiplicity of single grains deterioration of a bond (solder-, sinter)ruggedness and device-ruggedness of the semiconductor device 10 can be prevented or counteracted. By this approach contact implantations become superfluous, which would increase the leakage current or the dynamic losses, respectively. Furthermore, the ohmic contact characteristics between the first metal layer 107a and the emitter region 103 prevail over a wide temperature range.

The semiconductor body 100 may include Si or may at least include Si in a portion of the emitter region 103 directly adjoining the metal silicide layer 106. On a p-doped emitter region 103 including Si, the metal silicide layer 106 may include PtSi, IrSi, if the emitter region 103 is p-type. In case the emitter region 103 including Si is of an n-type, the metal silicide layer 106 may include TiSi. Thus, PtSi and IrSi in several phases as contact material enables the contacting of comparatively low p-doped emitter structures, which is beneficial for the electrical performance of power devices for reducing dynamic losses. In case of comparatively low n-doped emitter structures other appropriate silicides like TiSi may be used.

Figure 2:
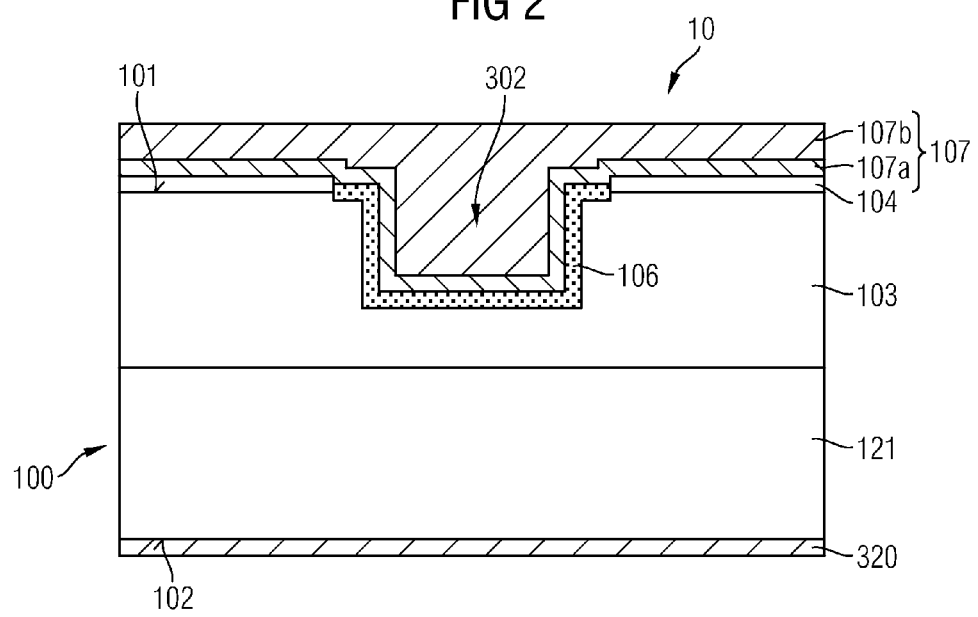
FIG. 2 is a schematic cross-sectional view of a portion of a semiconductor device in accordance with another embodiment.

FIG. 2 shows a semiconductor device 10 in accordance with another embodiment. The semiconductor device 10 is similar to the semiconductor device 10 as shown in FIG. 1, thus differences between the two embodiments will be described. Within the semiconductor body 100, a contact trench 302 is provided, which extends from the first surface 101 into the direction of the second surface 102 of the semiconductor body 100. The contact trench 302 extends into the emitter region 103 only and does not reach into the drift zone 121. A portion of the emitter region 103 directly adjoining the metal silicide layer 106 is formed at inner walls of the contact trench 302. A surrounding part of the first surface 101 neighbouring the contact trench 302 is covered with a dielectric 104. The emitter electrode 107 comprising the first metal layer 107a and the second metal layer 107b completely fill the contact trench 302 and cover the dielectric 104 disposed next to the contact trench 302 on the first surface 101 of the semiconductor body 100. The metal silicide layer 106 lines the inner walls of the contact trench 302. As shown in FIG. 2, the metal silicide layer 106 further lines a part of the first surface 101 of the semiconductor body 100, from which the dielectric 104 has been removed, e.g. by an etch process. In an embodiment, the metal silicide layer 106 may also selectively line the bottom wall of the contact trench (cf. FIG. 5F). Although FIG. 2 shows the top surface of the metal silicide layer 106 as being located below the top surface of the dielectric 104, the top surface of the metal silicide layer 106 may also be higher than the top surface of the dielectric 104, depending on the thickness of the dielectric 104 and the thickness of a metal layer 105 (cf. FIG. 4D) used to form the metal silicide layer 106. Although the layer structure of the metal silicide layer 106 and the first and second metal layers 107a, 107b is shown in FIG. 2 and FIG. 4G as having square-edged steps between the respective layers, the contact trench 302 may also be formed in such a way that the edges between the bottom wall and the side wall of the contact trench 302 and the edges between the semiconductor body 100 and the contact trench 302 at the first surface 101 are rounded, leading to an enhanced mechanical robustness of the above layer structure 106 and 107.

Figure 3:
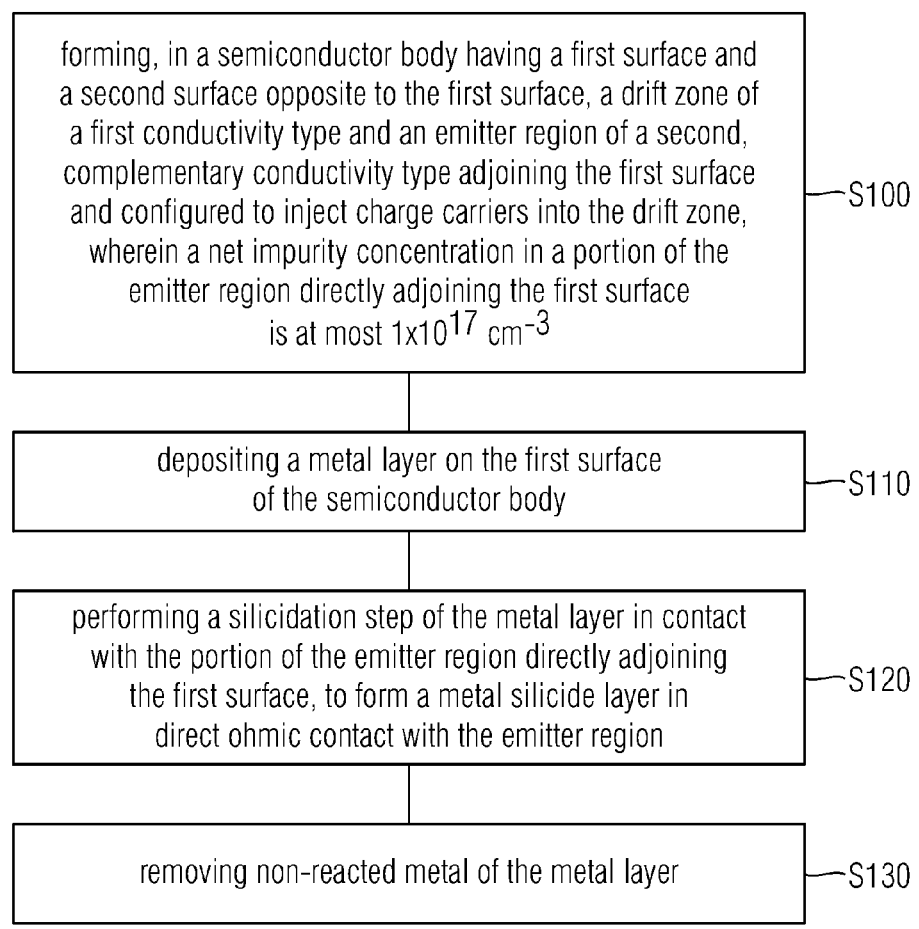
FIG. 3 is a schematic process chart of a method of manufacturing a semiconductor device in accordance with an embodiment.

FIG. 3 illustrates a schematic process chart of a method of manufacturing a semiconductor device.

Process feature S100 includes forming, in a semiconductor body having a first surface and a second surface opposite to the first surface, a drift zone of a first conductivity type and an emitter region of a second complementary conductivity type adjoining the first surface and configured to inject charge carriers into the drift zone, wherein a net impurity concentration in the portion of the emitter region directly adjoining the first surface is at most $1 \times 10^{17}$ cm$^{-3}$.

Process feature S110 includes depositing a metal layer on the first surface of the semiconductor body.

Process feature S120 includes performing a silicidation step of the metal layer in contact with the portion of the emitter region directly adjoining the first surface, to form a metal silicide layer in direct ohmic contact with the emitter region.

Process feature S130 includes removing non-reacted metal of the metal layer.

In FIG. 4A to 4G, a method of manufacturing the semiconductor device 10 according to an embodiment will be described with reference to cross-sectional views for illustration of selected processes.

Figure 4A:
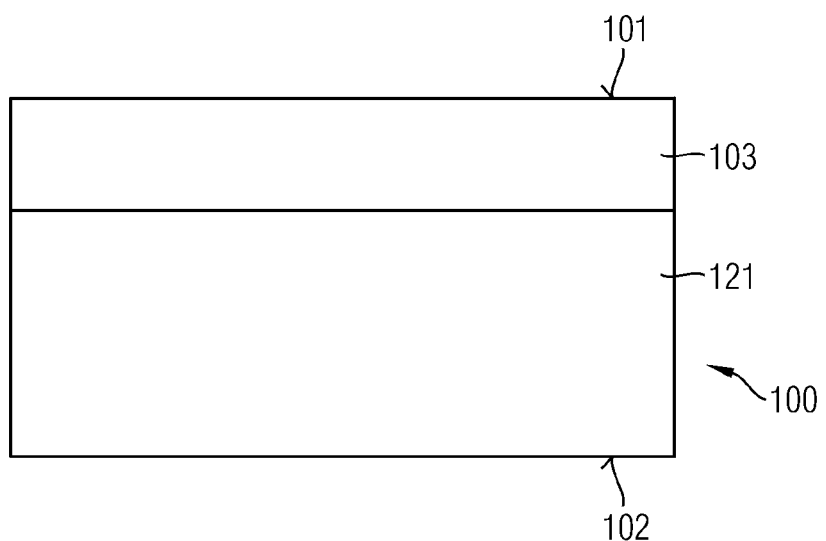
FIG. 4A to 4G are schematic cross-sectional views of a portion of a semiconductor device illustrating a method of manufacturing a semiconductor device in accordance with an embodiment.

In FIG. 4A, a drift zone 121 of a first conductivity type and an emitter region 103 of a second, complementary conductivity type adjoining the first surface 101 and configured to inject charge carriers into the drift zone 121 is formed in a semiconductor body 100. The net impurity concentration in a portion of the emitter region 103 directly adjoining the first surface 101 is adjusted to be at most $1 \times 10^{17}$ cm$^{-3}$.

Figure 4B:
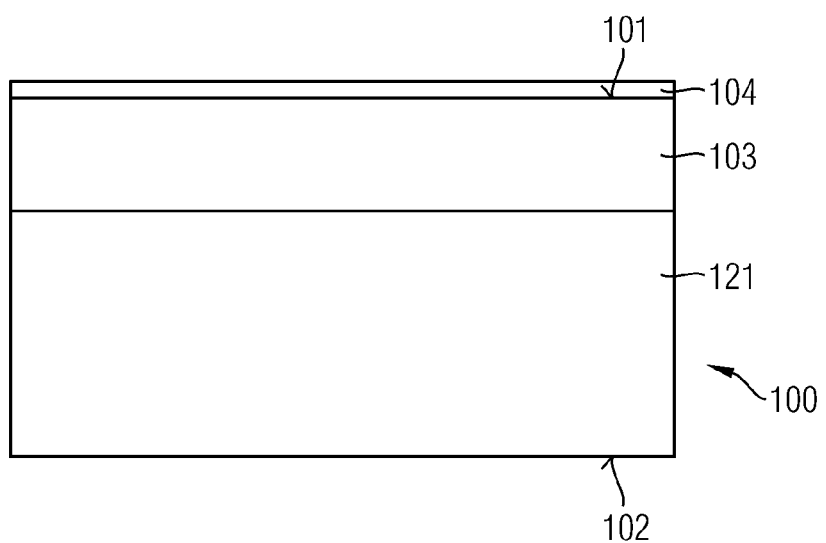

As shown in FIG. 4B, a dielectric 104 like a thermal silicon oxide layer is formed on the semiconductor body 100.

Figure 4C:
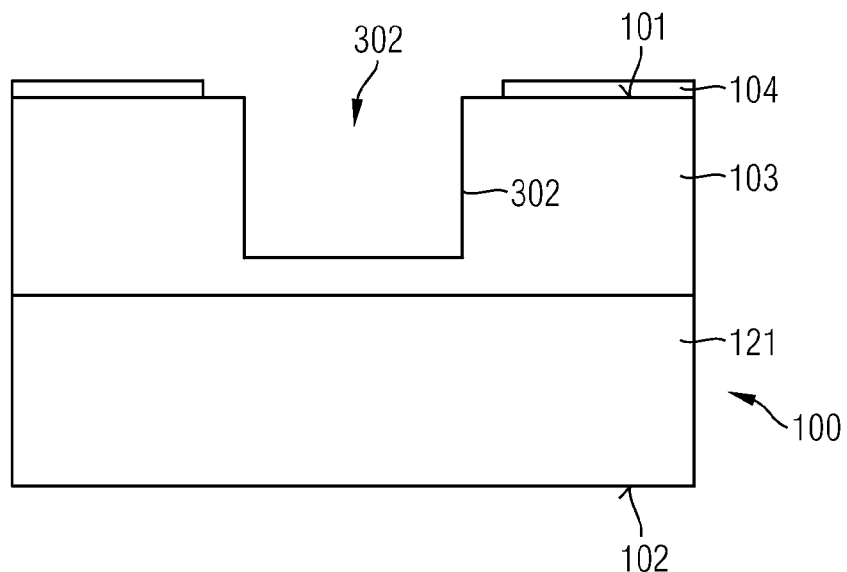

As shown in FIG. 4C, a part of the first surface 101 of the semiconductor body 100 is exposed by removing the dielectric 104 on the semiconductor body 100, e.g. by a photolithographic step. Within the exposed part of the first surface 101, a contact trench 302 extending from the first surface 101 in the direction to the second surface 102 is formed within the semiconductor body 100. The contact trench 302 may be formed by an etching process, for example by anisotropic etching using a mask layer, e.g. a hard mask layer patterned by lithography.

Figure 4D:
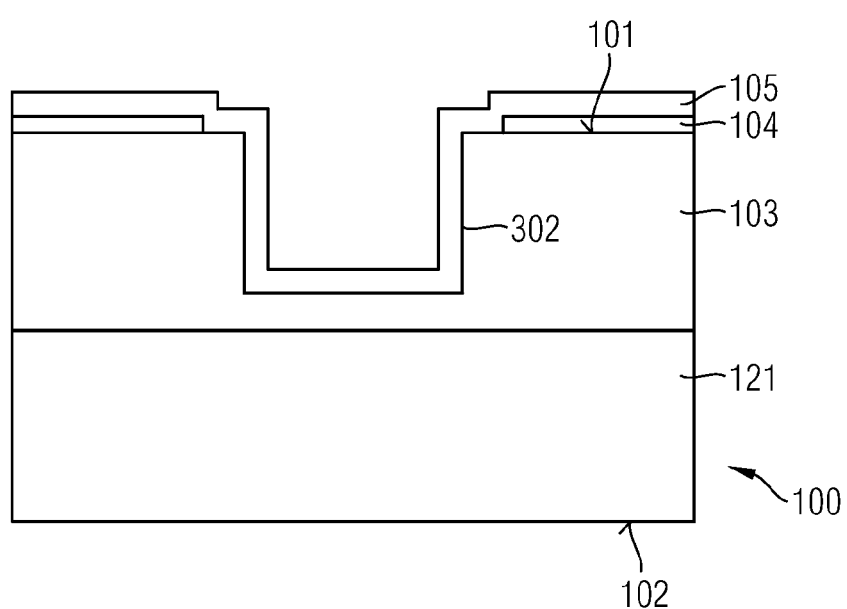

As shown in FIG. 4D, the metal layer 105 is deposited on the surface of the semiconductor body 100 including the contact trench 302 and the dielectric layer 104 next to the contact trench 302. The metal layer 105 may be formed on the dielectric 104, the first surface 101 of the semiconductor body 100, and the inner walls of the contact trench 302. The metal layer 105 may include Pt, Ir in case the emitter region is p-type or may include Ti in case the emitter region is n-type. The metal layer 105 may be deposited by an appropriate method, e.g. physical vapour deposition (PCD), chemical vapour deposition (CVD) electro-chemical deposition (ECD), and may have a thickness between 10 nm and 50 nm.

Figure 4E:
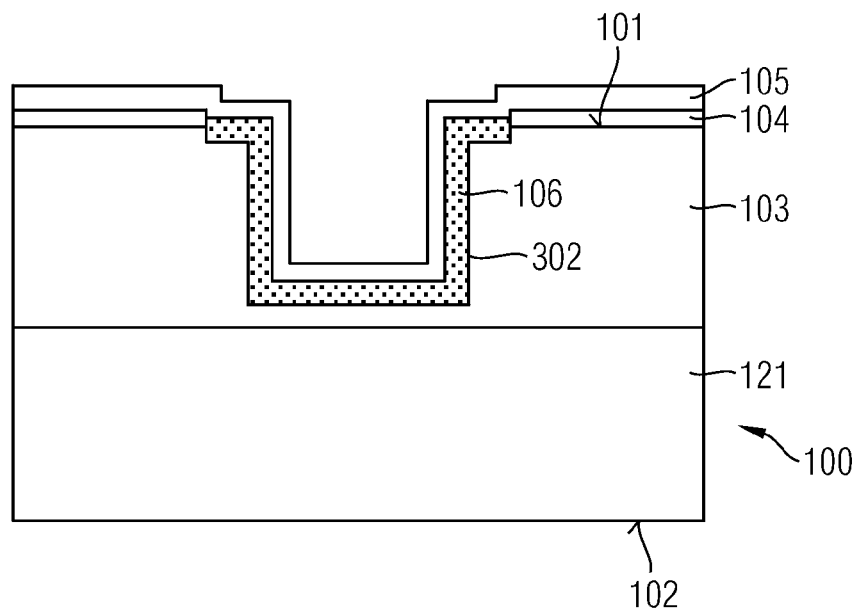

As shown in FIG. 4E, a metal silicide layer 106 may be formed in a silicidation step at moderate temperatures in a range of 300° C. to 700° C., which can be formed in a furnace, RTP (rapid thermal processing) or LTA (laser thermal annealing) process. As the semiconductor body 100 within the emitter region 103 is of Si or at least a portion of the emitter region 103 directly adjoining the metal layer 105 includes Si, the metal silicide layer 106 is formed where direct contact of the metal layer 105 to Si is available. As long no further high temperature budget is applied, the metal silicide layer 106 remains as a continuous layer. As can be further seen from FIG. 4E, the metal silicide layer 106 is not formed in a region, in which the metal layer 105 is not in direct contact with Si but in contact with the dielectric 104, which may be, for example, of SiO$_2$. Thus, the provision of a metal silicide layer 106 as a contact-liner material provides the option for a self-aligned process, when the metal silicide layer 106 is demanded only in direct contact to the semiconductor body 100 and mostly not to a dielectric layer 104. Moreover, the metal silicide layer 106 can be formed for improving the contact to a polysilicide layer. Thus, a silicidation step is performed with respect to the metal layer 105 in contact with the portion of the emitter region 103 directly adjoining the first surface 101, to form a metal silicide layer 106 in direct ohmic contact with the emitter region 103.

Figure 4F:
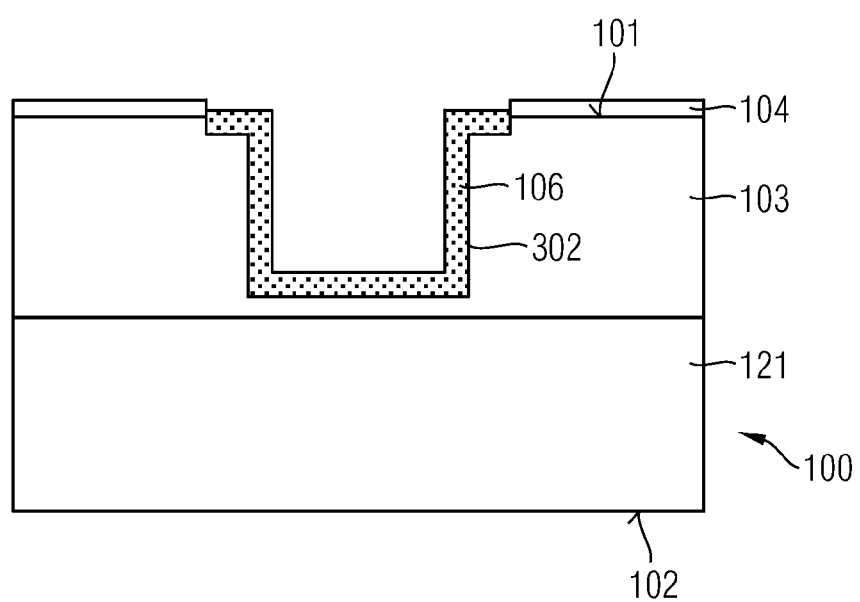
Figure 4G:
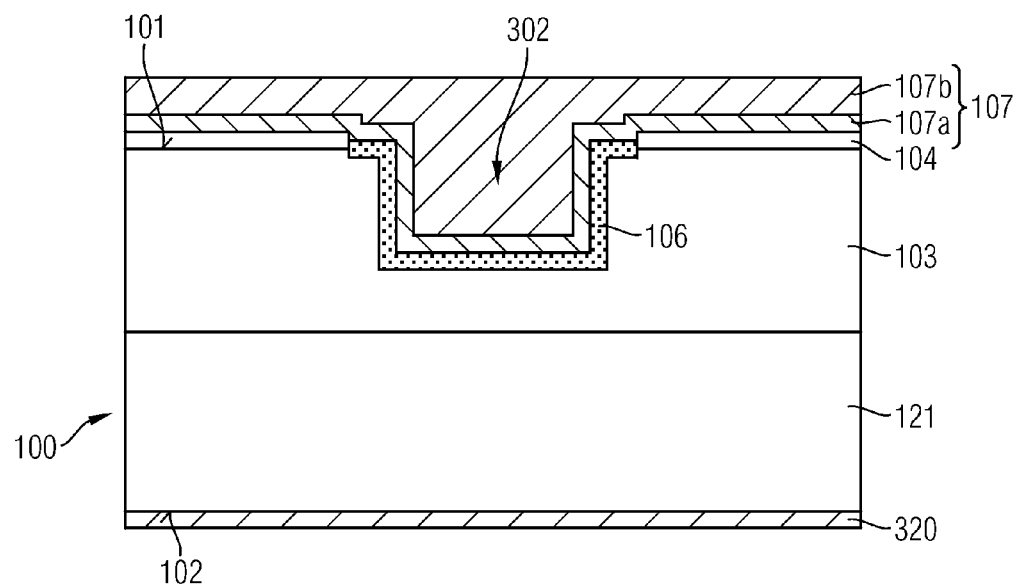

As shown in FIG. 4F, non-reacted metal of the metal layer 105 (e.g. metal of the metal layer 105 deposited on the dielectric 104) may be removed by aqua regia, for example, and the remaining stain film then may be etched by HF/HFB or the like.

As shown in FIG. 4G, on top of the dielectric 104 and the metal silicide layer 106, the emitter electrode 107 is deposited. The emitter electrode 107 may include a first metal layer 107a and a second metal layer 107b, as described above with regard to the embodiments in FIG. 1 and FIG. 2. In addition, the collector electrode 320 is formed on the second surface 102 to form the semiconductor device 10 as shown in FIG. 2.

The semiconductor structure as shown in FIG. 1 or 2 may be used for different embodiments like for weak backside emitters on a wafer or die backside, for weak front side emitters on a wafer or die front side, structured silicide layers for locally improving/lowering the contact resistance on front or backside, on structured or non-structured surfaces within and without topology, or for diodes and generally in power devices for low emitter areas.

The semiconductor device 10 may be applied for power semiconductor elements such as IGBTs, e.g. RC-IGTBs (reverse conducting insulated gate bipolar transistors), RB-IGBTs (reverse-blocking IGBTs), and IGFETs (insulated gate field effect transistors) including MOSFETs (metal oxide semiconductor field effect transistors) in the usual meaning including FETs with and without metal gate electrodes. The employment of the semiconductor device 10 has an advantage with focus on lowly doped emitter structures in RC-IGBTs and diodes on front side for reducing the stored charge carriers.

Figure 5A:
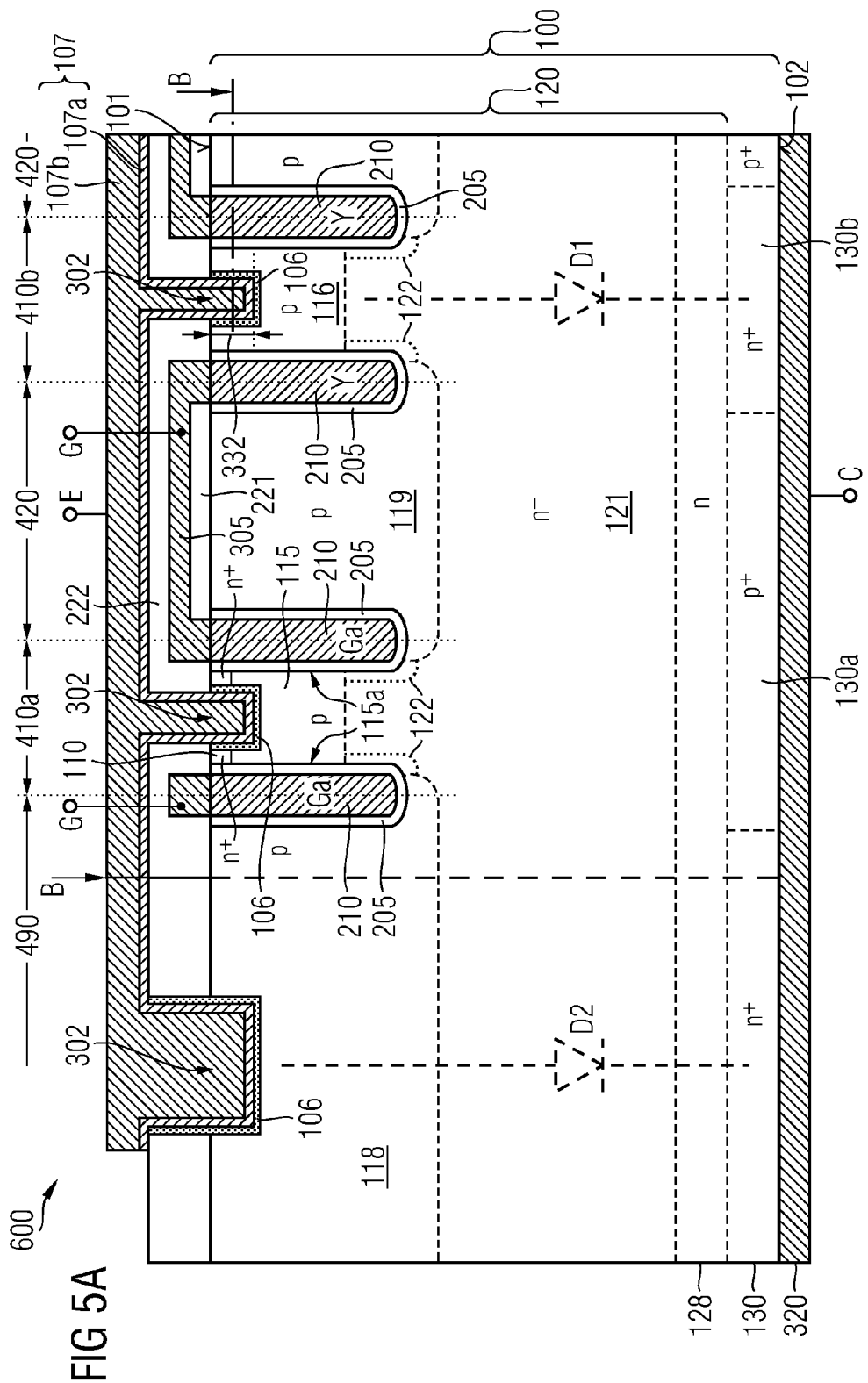
FIG. 5A is a schematic cross-sectional view of a portion of a trench-type RC-IGBT in accordance with an embodiment providing a contact trench and a metal silicide layer.

In the following, an embodiment of the semiconductor device 10 as described in FIGS. 1 and 2 will be described with regard to an RC-IGBT 600, which is schematically illustrated in FIG. 5A. RC-IGBTs monolithically integrate a freewheeling diode. When the RC-IGBT is forward biased, the RC-IGBT is effective as an electronic switch capable of switching on and off a current flowing in a first direction between a collector and an emitter terminal subject to a gate potential applied to a gate terminal. When the RC-IGBT is reverse-biased, the RC-IGBT conducts a current flowing in a second direction opposite to the first direction irrespective of the gate potential.

The RC-IGBT 600 includes a semiconductor body 100 having a first surface 101 and a second surface 102 parallel to the first surface 101. With respect to the semiconductor material and physical properties of the semiconductor body 100 the embodiments of FIG. 1 and FIG. 2 provide further details.

In the semiconductor body 100 a collector layer 130 directly adjoins the second surface 102. The collector layer 130 includes first portions 130a and second portions 130b, which may alternate in one lateral direction or in both lateral directions. The second portions 130b have a first conductivity type and the first portions 130a have a second, complementary conductivity type. Both the first and the second portions 130a, 130b are comparatively heavily doped. The mean net impurity concentrations may be at least $1 \times 10^{17}$ cm$^{-3}$, for example at least $5 \times 10^{17}$ cm$^{-3}$.

A collector electrode 320 directly adjoins the second surface 102 and is electrically connected to the collector layer 130. The collector electrode 320 may consist of or contain, as main constituent(s), aluminum Al, copper Cu or alloys of aluminum or copper, for example AlSi, AlCu, or AlSiCu. According to other embodiments, the collector electrode 320 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, and/or Pd. The collector layer 130 may provide or may be electrically connected to a collector terminal C of the RC-IGBT 600.

In the semiconductor body 100, a semiconducting layer 120 forms an interface with the collector layer 130, wherein the interface may be parallel to the first and second surfaces 101, 102. The semiconducting layer 120 may include a field stop layer 128 of the first conductivity type. The field stop layer 128 directly adjoins the collector layer 130. A mean net impurity concentration in the field stop layer 128 is lower than in the second portions 130b of the collector layer 130. For example, the mean net impurity concentration in the second portions 130b exceeds at least five times the mean net impurity concentration in the field stop layer 128. According to an embodiment, the mean net impurity concentration in the field stop layer 128 is between $5 \times 10^{15}$ cm$^{-3}$ and $1 \times 10^{17}$ cm$^{-3}$.

With the field stop layer 128, or, in absence of a field stop layer 128, with the collector layer 130 a low doped drift zone 121 of the first conductivity type forms an interface which is parallel to the first and second surfaces 101, 102. The mean net impurity concentration in the drift zone 121 is lower than in the field stop layer 128. According to an embodiment, the mean net impurity concentration in the field stop layer 128 exceeds at least five times the mean net impurity concentration in the drift zone 121. The mean net impurity concentration in the drift zone 121 may be between $5 \times 10^{12}$ cm$^{-3}$ and $5 \times 10^{14}$ cm$^{-3}$, by way of example.

Buried electrode structures 210 extend from the first surface 101 into the semiconductor body 100. Dielectric liners 205 separate the buried electrode structures 210 from the semiconductor material of the semiconductor body 100. The buried electrode structures 210 may be parallel stripes arranged in a regular pattern. According to other embodiments, the lateral cross-sectional areas of the buried electrode structures 210 may be circles, ellipsoids, ovals or rectangles, i.e. squares, with or without rounded corners, or rings. For example two or three buried electrode structures 210 may form an arrangement with two or three concentric rings, wherein the rings may be circles, ellipsoids, ovals, or rectangles, e.g. squares with rounded corners.

An IGBT cell 410a is formed in the semiconductor body 100 between two neighboring buried electrode structures 210 or within a ring-shaped buried electrode structure 210. In each IGBT cell 410a a body zone 115 of the second conductivity type may extend between the two neighboring buried electrode structures 210 or within the ring-shaped buried electrode structure 210. The body zone 115 forms a pn junction with the drift zone 121. In each IGBT cell 410a at least one, e.g. two, source zones 110 of the first conductivity type may extend from the first surface 101 into the semiconductor body 100. Each source zone 110 forms a pn junction with the body zones 115. The source zones 110 directly adjoin the dielectric liner 205.

The semiconductor body 100 may include a plurality of approximately identical IGBT cells 410a arranged in regular patterns in one or more cell arrays. The IGBT cells 410a may be aligned with the first portions 130a of the collector layer 130. For example, the body zones 115 may be formed in a vertical projection of the first portions 130a.

Buried electrode structures 210 directly adjoining the IGBT cells 410a provide insulated gate electrodes Ga. A potential applied to the insulated gate electrodes Ga controls a minority charge carrier distribution in channel portions 115a of the body zones 115, wherein the channel portions 115a adjoin the insulated gate electrodes Ga between the source zones 110 and the drift zone 121. If in a forward biased mode the gate potential applied to the insulated gate electrodes Ga exceeds a predefined threshold voltage, inversion channels of the first conductivity type are formed in the body zones 115 along the insulated gate electrodes Ga and an on state current flows between the source zones 110 and the collector layer 130. Other buried electrode structures 210 provide auxiliary electrodes Y.

In addition to the IGBT cells 410a, the semiconductor body 100 may include at least one diode cell 410b and/or at least one spacer region 420. Each spacer region 420 may separate two neighboring IGBT cells 410a, two neighboring diode cells 410b, or may be formed between an IGBT cell 410a and a diode cell 410b.

In each diode cell 410b an anode zone 116 of the second conductivity type is formed between two neighboring buried electrode structures 210 or within a ring-shaped buried electrode structure 210 between the first surface 101 and the drift zone 121. Each anode zone 116 forms a pn junction with the drift zone 121 and may be aligned with the second portions 130b of the collector layer 130. For example, the anode zones 116 may be formed in a vertical projection of the second portions 130b.

In each spacer region 420 a floating zone 119 of the second conductivity type may extend between neighboring buried electrode structures 210 or within a ring-shaped buried electrode structure 210 from the first surface 101 into the semiconductor body 100. The floating zones 119 may extend deeper into the semiconductor body 100 than the body and anode zones 115, 116. In accordance with an embodiment, the floating zones 119 extend deeper into the semiconductor body 100 than the buried electrode structures 210 and the buried electrode structures 210 may extend deeper into the semiconductor body 100 than the body zones 115 and the anode zones 116.

The anode zone 116 is one example of a supplementary zone of the second conductivity type, which are formed outside the IGBT cells 410a and have the same conductivity type as the body zone 115. Another example of a supplementary zone is a termination zone 118 of the second conductivity type in an edge area 490. The edge area 490 surrounds a cell area with the IGBT cells 410a, diode cells 410b and spacer regions 420. In the cell area the anode zones 116 of the diode cells 410b form a first pn junction D1 with the drift zone 121. The termination zone 118 directly adjoins the first surface 101 and forms a second pn junction D2 with the drift zone 121.

Contact trenches 302 extend from the first surface 101 into the semiconductor body 100 in the IGBT cells 410a. In addition, contact trenches 302 may be provided in the diode cells 410b. According to the illustrated embodiment the contact trenches 302 reach the body zones 115 at a distance to the first surface 101 such that the source zones 110 are formed in mesa portions between the insulated gate electrodes Ga and the contact trenches 302. The contact trenches 302 reduce the total impurity amount in the body zones 115 and in the anode zones 116. The source zones 110 of an IGBT cell 410a may directly adjoin a sidewall of the contact trench 302 that is tilted to the first surface 101. According to an embodiment, the contact trenches 302 have approximately vertical sidewalls.

A wiring structure 305 may electrically connect neighboring buried electrode structures 210 with each other and with a gate terminal G. The wiring structure 305 may be provided from a highly conductive semiconductor material and/or may contain one or more metal layers provided from a metal or a metal compound, respectively. A first dielectric structure 221 dielectrically insulates the wiring structure 305 from the floating zones 119 in the semiconductor body 100. A second dielectric structure 222 dielectrically insulates the wiring structure 305 from an emitter electrode 107.

The emitter electrode 107 extends through openings of the layer structure including the first and second dielectric structures 221, 222 and the wiring structure 305. The emitter electrode 107 in the contact trenches 302 is electrically connected with the source zones 110, the body zones 113, the anode zones 116, and the termination zones 118, whereas the floating zones 119 are dielectrically insulated from the emitter electrode 107. The emitter electrode 107 may provide or may be electrically connected with an emitter terminal E of the RC-IGBT 600.

The emitter electrode 107 includes a first metal layer 107a, a second metal layer 107b, and a metal silicide layer 106. Within the contact trenches 302, the first metal layer 107a is sandwiched between the second metal layer 107b and the metal silicide layer 106 lining the inner walls of the contact trenches 302 within the semiconductor body 100. The metal silicide layer 106 directly adjoins at least one body zone 115 or one of the supplementary zones like the anode zone 116 or the termination zone 118. A thickness of the first metal layer 107a may be less than a half of a width of the contact trenches 302. For example, the first metal layer 107a has a thickness of at least 25 nm. Although contact trenches 302 are used in the embodiment shown in FIG. 5A to provide an electrical contact between the emitter electrode 107 and the source zones 110, the body zones 113, the anode zones 116, and the termination zones 118, at least one of these contacts may also be provided by a contact structure having the first surface 101 as a boundary between the first metal layer 107a and the metal silicide layer 106.

In an embodiment, a net impurity concentration in a portion of at least one of the body zone 115 and the supplementary zone like the anode zone 116 or the termination zone 118 directly adjoining inner walls of the contact trenches 302 may be at most $1 \times 10^{17}$ cm$^{-3}$. In another embodiment, a net impurity concentration in a portion of at least one of the body zone 115 and the supplementary zone like the anode zone 116 or the termination zone 118 directly adjoining inner walls of the contact trenches 302 may be at most $5 \times 10^{16}$ cm$^{-3}$. In still another embodiment, a net impurity concentration in a portion of at least one of the body zone 115 and the supplementary zone like the anode zone 116 or the termination zone 118 directly adjoining inner walls of the contact trenches 302 may be at most $1 \times 10^{16}$ cm$^{-3}$. The material composition of the first metal layer 107a and the second metal layer 107b as well as the physical properties in view of a contact with a weakly doped emitter structure has been already described with regard to FIGS. 1 and 2 and should not be described again. In the same way as described above, a direct contact between one of these low-doped zones 115, 116, or 118 and the first metal layer 107a may lead to a high contact resistance or to undesired Schottky contact properties. By provision of the metal silicide layer 106 between one of the zones 115, 116 or 118 and the first metal layer 107a, an ohmic or almost ohmic contact between the emitter electrode 107 and the low-doped body zone 115, anode zone 116 or termination zone 118 can be achieved. As a result, a front side weak emitter can be provided in the RC-IGBT 600 and electrically contacted without the provision of any further heavily-doped contact zones. A method for forming the metal silicide layer 106 has already been described above with respect to FIGS. 3 and 4A to 4G. Concerning the material composition of the metal silicide layer 106, it is referred to the description of the embodiments of FIGS. 1 and 2.

Figure 5B:
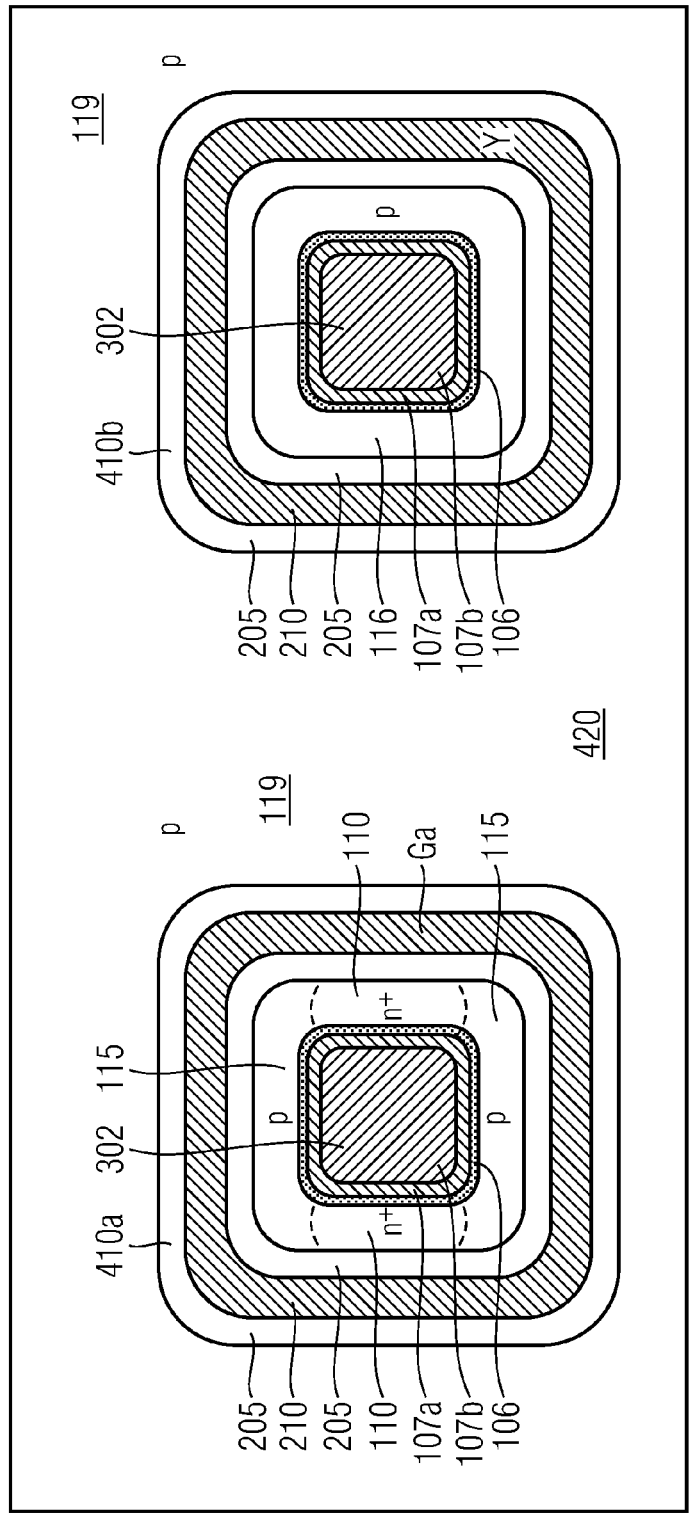
FIG. 5B is a schematic cross-sectional view of the portion of the RC-IGBT of FIG. 5A along line B-B.

FIG. 5B is a schematic cross-sectional view of the portion of the RC-IGBT of FIG. 5A along line B-B and shows ring-shaped buried electrode structures 210 forming the insulated gate electrodes Ga and the auxiliary electrodes Y. The contact trenches 302 and the ring-shaped buried electrode structures 210 may be concentric. On the left-hand side, a first ring-shaped buried electrode structure 210 defines an IGBT region 410a. The source zone 110 may be ring-shaped and may surround the contact trench 302 on all sides. According to an embodiment, the source zone 110 is formed along only one of the edges of the respective contact trench 302. According to the illustrated embodiment, two spatially separated portions of the source zone 110 are formed at opposing sides of the contact trench 302. On the right-hand side, a second ring-shaped buried electrode structure 210 defines a diode cell 410b. A spacer region 420 with a floating region 119 embeds the IGBT and diode cells 410a, 410b. Although ring-shaped buried electrode structures 210 and concentric contact trenches 302 are shown in FIG. 5B, the buried electrode structures 210 and the contact trenches 302 may also be formed as parallel stripes.

Figure 5C:
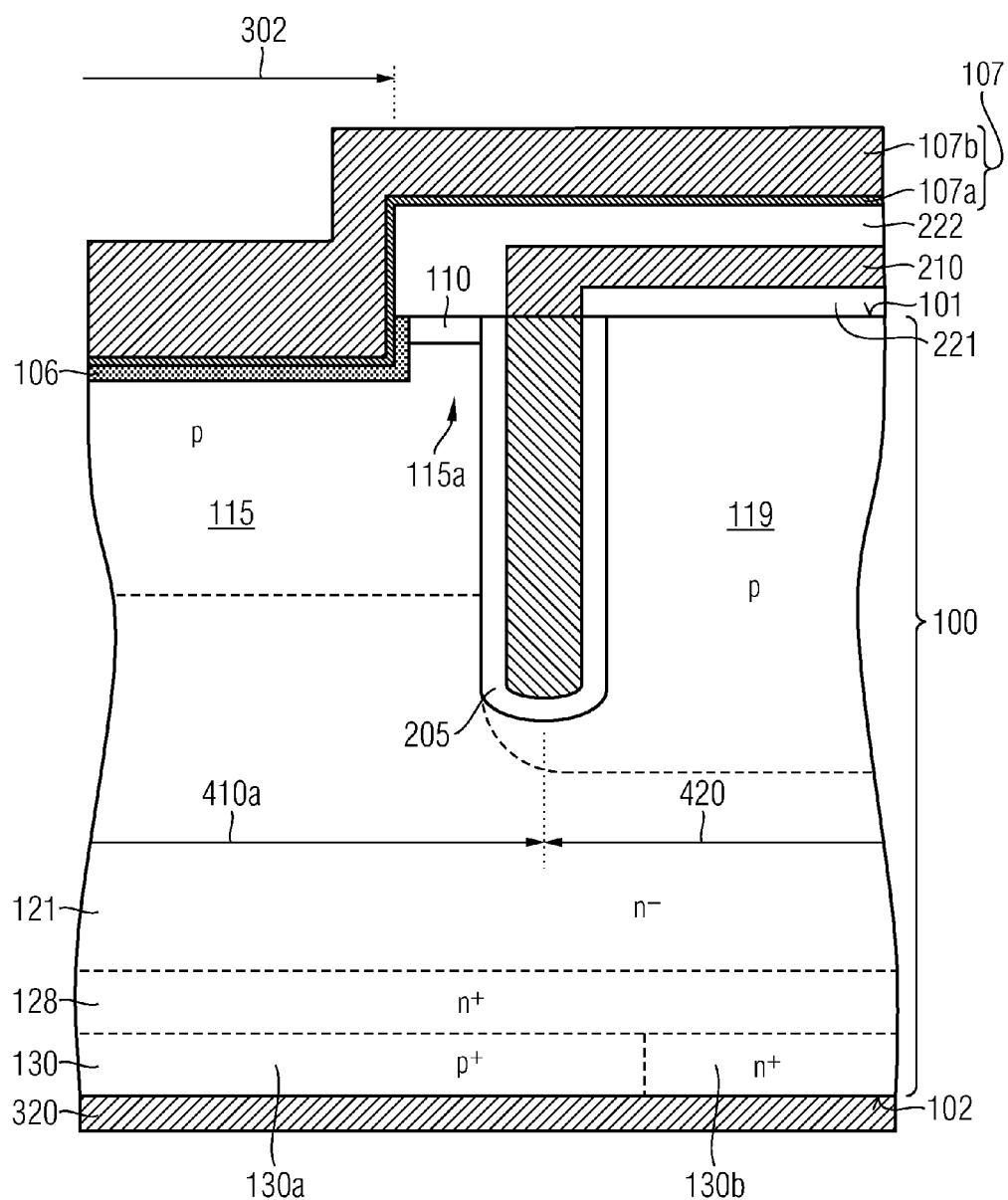
FIG. 5C is a detailed schematic cross-sectional view of a portion of a trench-type RC-IGBT of FIG. 5A.
Figure 5D:
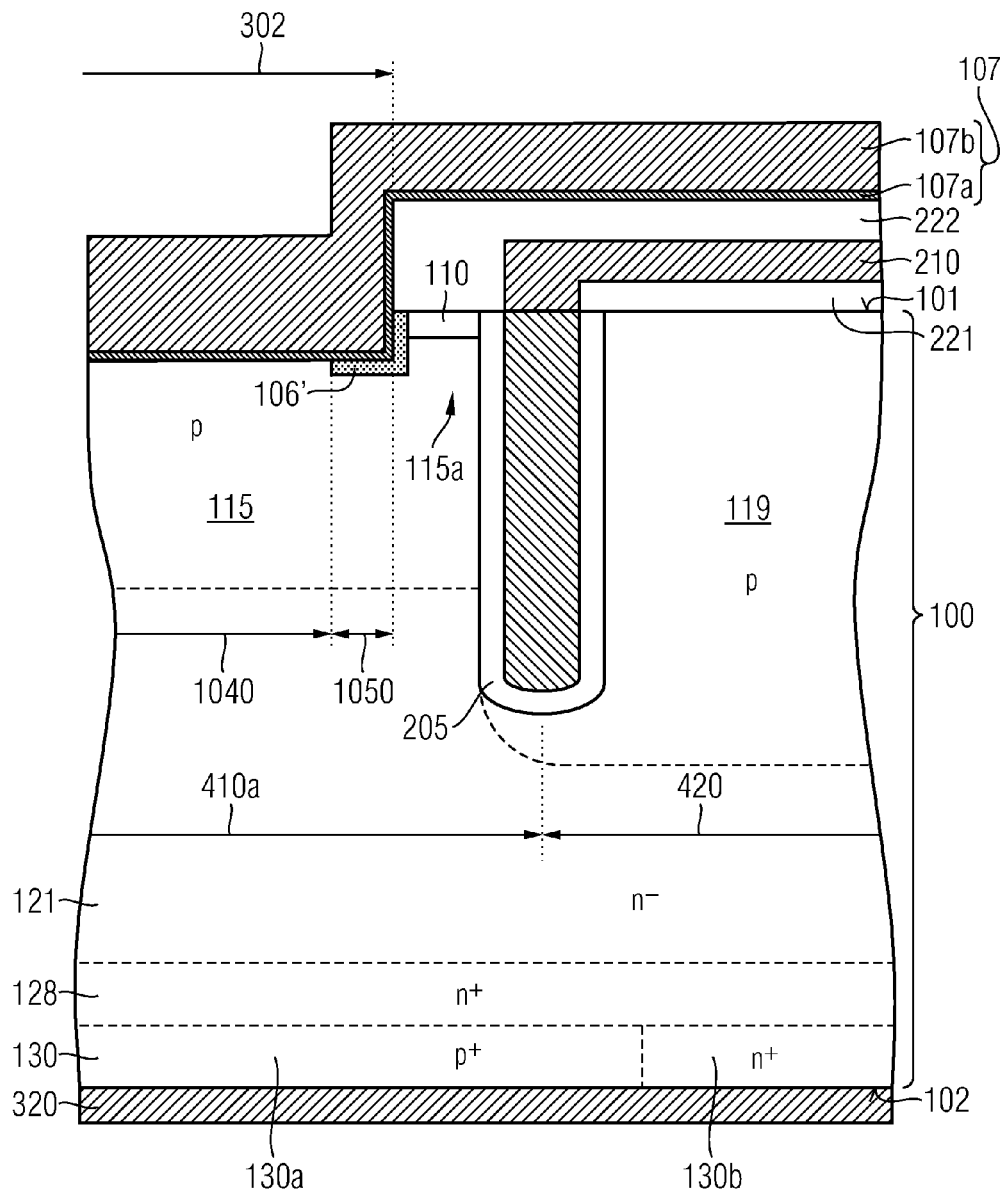
FIG. 5D is a schematic cross-sectional view of a portion of a trench-type RC-IGBT in accordance with an embodiment providing a contact trench and a patterned metal silicide layer.

FIG. 5C is a detailed schematic cross-sectional view of a portion of a trench-type RC-IGBT of FIG. 5A. As can be seen in detail, the metal silicide layer 106 lines the inner walls of the contact trench 302 as a continuous layer. Although FIG. 5A, 5C and 5D show the metal silicide layer 106 selectively lining the inner walls of the contact trench 302 while not extending over the first surface 101, the metal silicide layer 106 may also have a structure being comparable to that as shown in FIG. 2, in which the metal silicide layer 106 is also formed on a part of the first surface 101, which surrounds the contact trench 302 and which is not covered with the dielectric 104. The source zones 110 are provided in mesa portions between the contact trench 302 and the insulated gate structures Ga. The source zones 110 directly adjoin the metal silicide layer 106. The source zones 110 of the first conductivity type are heavily doped and form an ohmic contact with the metal silicide layer 106. By means of the metal silicide layer 106 directly adjoining the low-doped body zone 115, an ohmic contact is also provided between the emitter electrode 107 and the body zone 115. As a result, p+ contact zones or p+ guard rings usually provided to ensure an ohmic contact between the body zone and the emitter electrode 107, to prevent a latch-up effect, which results in further process steps, are not necessary.

According to an embodiment of FIG. 5D, a metal silicide layer 106' provided in an inner portion 1040 of the contact trench 302 is mainly or completely absent at a bottom wall of the contact trench 302 and is mainly or exclusively formed at inner side walls and an outer portion 1050 of the bottom wall of the contact trench 302. The inner and outer portions 1040, 1050 may overlap or may be spaced or may directly adjoin each other. The first metal layer 107a of the emitter electrode 107 directly adjoins the body zones 115, anode zones 116 and termination zones 118 in the inner portion 1040 and reduces diode hole emitter efficiency both in the cell area and in the edge area 490.

Figure 5E:
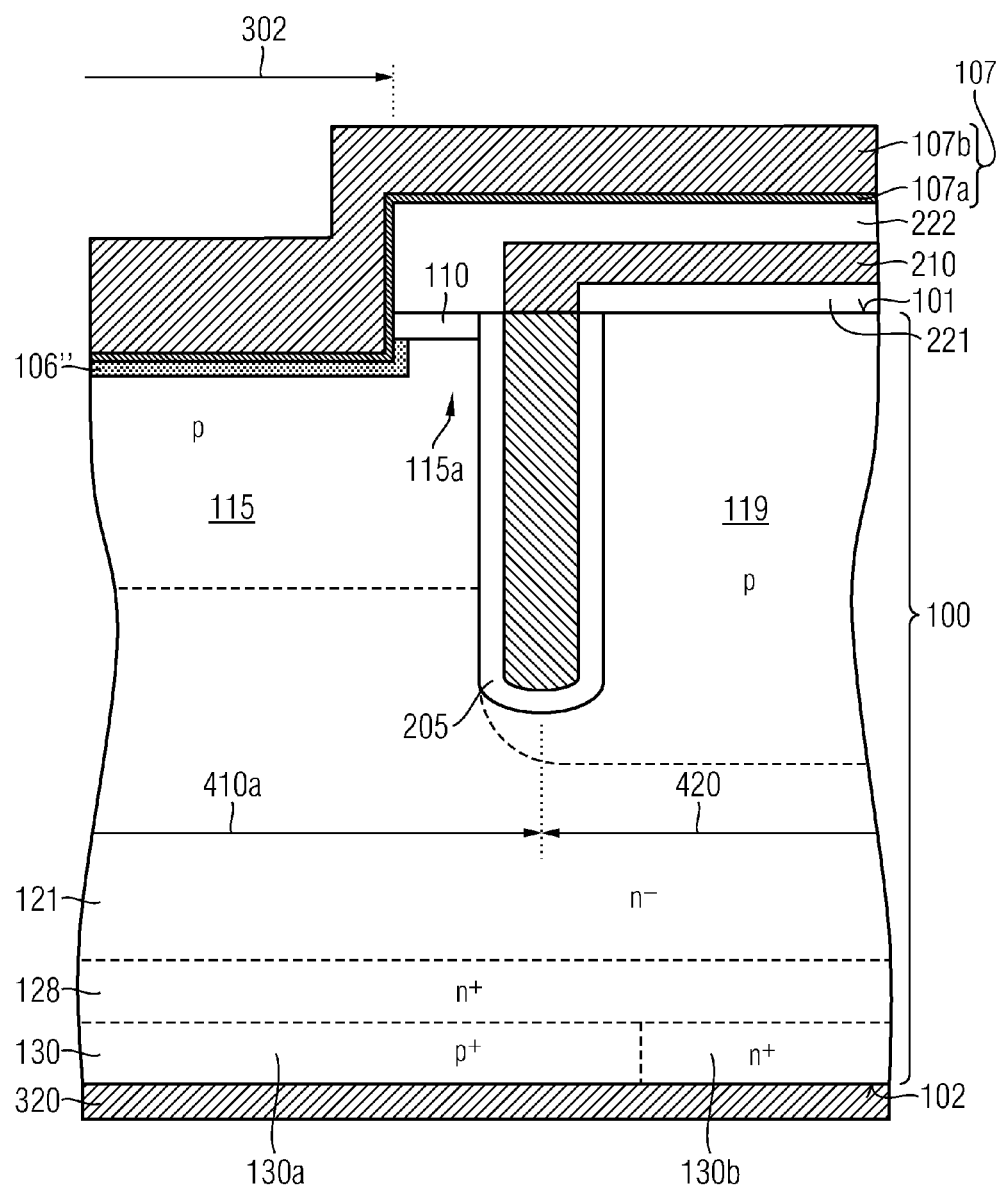
FIG. 5E is a schematic cross-sectional view of a portion of a trench-type RC-IGBT in accordance with an embodiment providing a contact trench and a patterned metal silicide layer not adjoining source zones of the RC-IGBT.
Figure 5F:
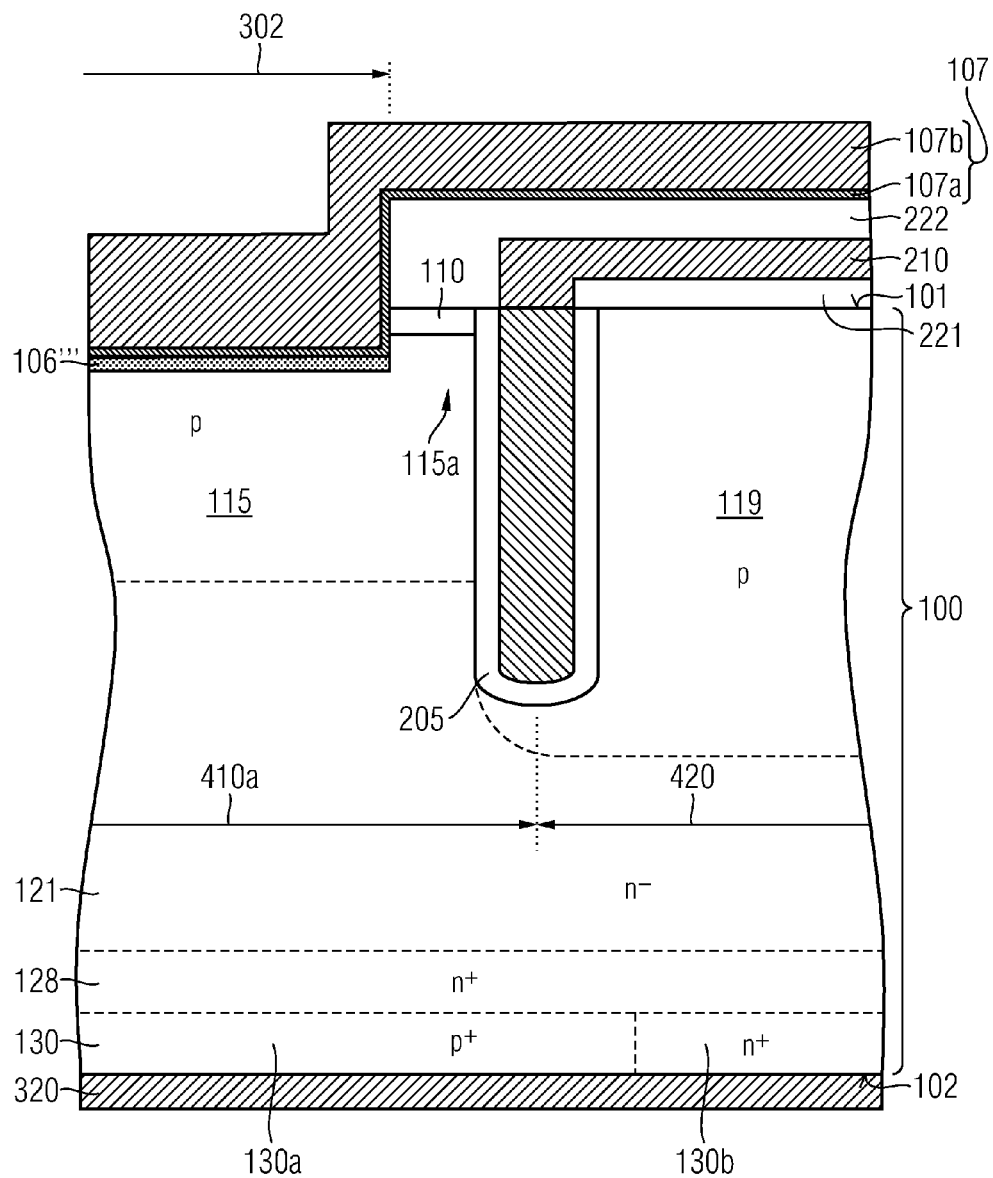
FIG. 5F is a schematic cross-sectional view of a portion of a trench-type RC-IGBT in accordance with an embodiment providing a contact trench and a metal silicide layer selectively lining the bottom wall of the contact trench.

According to an embodiment of FIG. 5E, a metal silicide layer 106" lines the inner walls of the contact trench 302 as a continuous layer but is not formed at portions of the contact trench 302 adjoining the source zones 110. The source zones 110 of the first conductivity type are heavily doped and form an ohmic contact with the first metal layer 107a.

According to an embodiment of FIG. 5E, a metal silicide layer 106''' selectively lines the bottom wall of the contact trench 302.

For the following description of the effects of the embodiments, the RC-IGBT 600 is assumed to be an n-channel IGBT with the first conductivity type being the n-type and the second conductivity type being the p-type. Equivalent considerations apply to p-channel IGBTs.

The RC-IGBT 600 can be operated in a forward biased mode and in a reverse biased mode. In the forward biased mode, a forward voltage is applied between the collector terminal C and the emitter terminal E that reverse biases the pn junctions between the body zones 115 and the drift zone 121 and the pn junctions between the anode zones 116 and the drift zone 121.

The n-channel RC-IGBT 600 is forward biased when a positive voltage is applied between the collector and emitter terminals C, E. In the forward biased mode a gate potential applied to the gate terminal G controls whether the RC-IGBT 600 is switched on or off. A gate potential higher than a threshold voltage generates a conducting inversion channel in the channel portions 115a of the body zone 115 between the source zone 110 and the drift zone 121. Through the inversion channel the source zones 110 inject n-type charge carriers (electrons) into the drift zone 121. The first portions 130a of the collector layer 130 inject p-type charge carriers (holes) into the drift zone 121. The charge carriers injected into the drift zone 121 generate a charge carrier plasma providing a low on-state resistance.

When in the forward biased mode the gate potential is below the threshold voltage at which the inversion channel is formed, the RC-IGBT 600 is in the off state. The voltage applied between the emitter and collector terminals E, C causes a depletion region that is generated along the pn junctions between the drift zone 121 and the body zones 115 to extend deeper into the drift zone 121. The maximum voltage the RC-IGBT 600 is capable to sustain before an avalanche breakdown occurs defines the voltage blocking capability specified for the RC-IGBT 600.

In the reverse biased mode a negative voltage is applied between the collector and the emitter terminals C, E such that the pn junctions between the body and the drift zones 115, 121 and the pn junctions between the anode zones 116 and the n-doped drift zone 121 are forward biased. The pn junctions conduct a current irrespective of whether or not an inversion channel is formed in the body zones 115.

The p-type impurity zones electrically connected to the emitter electrode 107, i.e. the body zones 115, and the supplementary zones like the anode zones 116 inject p-type charge carriers (holes) into the drift zone 121 and the n-type second portions 130b of the collector layer 130 inject n-type charge carriers (electrons) into the drift zone 121. The injected charge carriers form a charge carrier plasma. When the RC-IGBT 600 switches from the reverse biased mode to the off state of the forward biased mode, the charge carrier plasma has to be removed from the drift zone 121 before the RC-IGBT 600 can block. Irrespective of the applied gate potential the RC-IGBT 600 may temporarily conduct a recovery current after having been switched into the forward biased mode. The recovery current removes the charge carrier plasma from the drift zone 121. The recovery current results in reverse recovery losses and contributes to the overall switching losses.

A positive desaturation pulse may be applied to the gate terminal G in the reverse biased state such that an n-type inversion channel is formed through the body zone 115 shortly before the RC-IGBT 600 is forward biased. In the inversion channel the electrons bypass the body zones 115 and less holes are injected from the body zones into the drift zone 121. The charge carrier plasma is partially released. After expiration of the desaturation pulse the potential at the gate electrode G is reduced such that the n-type inversion channel disappears. When shortly after the desaturation pulse the RC-IGBT changes from the reverse biased mode to the forward biased off-state, less charge carriers have to be dissipated from the drift zone 121 such that the RC-IGBT 600 is faster in the blocking state and reverse recovery losses are significantly reduced.

At a first off state gate voltage of 0 V, no inversion channel is formed. If a second off state gate voltage applied to the insulated gate electrodes Ga is negative enough, p-type inversion layers 122 (p-channels) are formed in the drift zone 121 along the dielectric liner 205. The p-channels 122 of the insulated gate electrodes Ga may connect the p-type body zones 115 with the p-type floating zones 119. In the latter case, the p-type floating zones 119 contribute to the diode hole emitter efficiency. As a consequence the RC-IGBT 600 exhibits values for the diode forward current $I_F$ and for the switching losses which are significantly different for the two different off-state gate voltages. Inter alia in half bridge circuits the device characteristics of the integrated freewheeling diode in the RC-IGBT 600 can be tailored to fulfill different requirements during operation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein, e.g. planar IGBT cells with the gate electrode structure formed on the first surface. Therefore, it is intended that this invention be limited only by the claims and the equivalents thereof.

What is claimed is:

1. A semiconductor device comprising a semiconductor body including:
    a drift zone of a first conductivity type;
    an emitter region of a second, complementary conductivity type configured to inject charge carriers into the drift zone;
    an emitter electrode comprising a metal silicide layer in direct ohmic contact with the emitter region,
    wherein a net impurity concentration in a portion of the emitter region directly adjoining the metal silicide layer is at most $1 \times 10^{17}$ cm$^{-3}$; and a contact trench formed within the semiconductor body, wherein the portion of the emitter region directly adjoining the metal silicide layer formed at inner walls of the contact trench.

2. The semiconductor device according to claim 1, wherein the semiconductor body includes Si at least in a portion of the emitter region directly adjoining the metal silicide layer.

3. The semiconductor device according to claim 1, wherein the emitter region is p-type and the metal silicide layer includes PtSi or IrSi.

4. The semiconductor device according to claim 1, wherein the emitter region is n-type and the metal silicide layer includes TiSi.

5. The semiconductor device according to claim 1, wherein the emitter electrode includes at least one of TiN, TiW, Ta, TaN, AlSiCu, AlCu, and Cu on the metal silicide layer.

6. The semiconductor device according to claim 5, wherein the emitter electrode comprises a first metal layer in contact with the metal silicide layer including at least one of TiN, TiW, Ta and TaN and a second metal layer on the first metal layer comprising at least one of AlSiCu, AlCu, and Cu.

7. The semiconductor device according to claim 1, wherein the metal silicide layer selectively lines a bottom wall of the contact trench.

8. The semiconductor device of claim 1, wherein the trench is completely filled with the emitter electrode.

9. An IGBT, comprising:
    a semiconductor body comprising IGBT cells, at least one of the IGBT cells comprising a source zone of a first conductivity type, a body zone of a second, complementary conductivity type, and a drift zone of the first conductivity type separated from the source zone by the body zone;
    an emitter electrode comprising a metal silicide layer that directly adjoins at least one of the body zone and a supplementary zone of the second conductivity type, wherein a net impurity concentration in a portion of at least one of the body zone and the supplementary zone directly adjoining the metal silicide layer is at most $1 \times 10^{17}$ cm$^{-3}$; and an insulated gate electrode and a contact trench filled with the emitter electrode extending from a first surface into the semiconductor body.

10. The IGBT according to claim 9, wherein the emitter electrode further comprises a first metal layer on the metal silicide layer including at least one of TiN, TiW, Ta and TaN and a second metal layer on the first metal layer comprising at least one of AlSiCu, AlCu, and Cu.

11. The IGBT according to claim 9, wherein the metal silicide layer directly adjoins the source zones and the body zones.

12. The IGBT of claim 9, wherein the supplementary zone is an anode zone of a diode cell, the anode zone forming a pn junction with the drift zone.

13. The IGBT of claim 9, wherein the supplementary zone is a termination zone in an edge area surrounding a cell area including the IGBT cells.

* * * * *

UNITED STATES PATENT AND TRADEMARK OFFICE
CERTIFICATE OF CORRECTION

PATENT NO.        : 9,240,450 B2                          Page 1 of 1
APPLICATION NO.   : 14/178419
DATED             : January 19, 2016
INVENTOR(S)       : D. Werber et al.

It is certified that error appears in the above-identified patent and that said Letters Patent is hereby corrected as shown below:

Claims
Column 13, line 37 (claim 1, line 14) please change "layer formed" to -- layer is formed --

Signed and Sealed this
Twenty-fourth Day of May, 2016

Michelle K. Lee
*Director of the United States Patent and Trademark Office*